(12) United States Patent
Limbeck et al.

(10) Patent No.: US 9,279,623 B2
(45) Date of Patent: Mar. 8, 2016

(54) DEVICE HAVING A HEAT EXCHANGER FOR A THERMOELECTRIC GENERATOR OF A MOTOR VEHICLE AND MOTOR VEHICLE HAVING THE DEVICE

(71) Applicant: EMITEC GESELLSCHAFT FUER EMISSIONSTECHNOLOGIE MBH, Lohmar (DE)

(72) Inventors: Sigrid Limbeck, Much (DE); Rolf Brueck, Bergisch Gladbach (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 0 days.

(21) Appl. No.: 14/053,766

(22) Filed: Oct. 15, 2013

(65) Prior Publication Data

US 2014/0033702 A1    Feb. 6, 2014

Related U.S. Application Data

(63) Continuation of application No. PCT/EP2012/056332, filed on Apr. 5, 2012.

(30) Foreign Application Priority Data

Apr. 13, 2011    (DE) .......................... 10 2011 016 886

(51) Int. Cl.
*F01N 3/02* (2006.01)
*F01N 5/02* (2006.01)
(Continued)

(52) U.S. Cl.
CPC . *F28F 1/00* (2013.01); *F01N 3/043* (2013.01); *F01N 5/025* (2013.01); *F02G 5/02* (2013.01);
(Continued)

(58) Field of Classification Search
CPC ..... F01N 3/043; F01N 5/025; F01N 2240/02; F01N 2240/036; F01N 2260/14; F01N 2410/00; F01N 2410/02; F01N 2470/08; F01N 2470/24; F02G 5/02; F28F 1/00; F28F 13/06; F28D 7/1669; F28D 21/0003; H01L 35/30; Y02T 10/16; Y02T 10/166; Y02T 10/20
USPC .......................... 60/320; 165/104.11, 104.19
See application file for complete search history.

(56) References Cited

U.S. PATENT DOCUMENTS 3,884,297 A    5/1975    Fegraus et al.
4,773,474 A    9/1988    Stay
(Continued)

FOREIGN PATENT DOCUMENTS

DE        10355649 A1    12/2005
DE    202004013882 U1     1/2006
(Continued)

OTHER PUBLICATIONS

International Search Report of PCT/EP2012/056332, Dated Oct. 11, 2012.

*Primary Examiner* — Audrey K Bradley
(74) *Attorney, Agent, or Firm* — Laurence A. Greenberg; Werner H. Stemer; Ralph E. Locher

(57) ABSTRACT

A device having a heat exchanger includes a housing having an inlet and an outlet for a fluid and an inner tube having a first end face extending in axial direction, an opposite second end face and a circumferential surface having openings. A plurality of heat exchanger tubes is disposed parallel to the axial direction on the outside of the circumferential surface. The housing encloses the heat exchanger tubes and the inner tube and the inlet is fluidically connected to the first end face. Guide elements are disposed between the heat exchanger tubes so that the fluid entering the inner tube through the first end face flows out across the heat exchanger tubes in radial direction starting from the inner tube. The device is used particularly for constructing a thermoelectric generator for positioning in the underbody of a motor vehicle. A motor vehicle having the device is also provided.

13 Claims, 3 Drawing Sheets

(51) Int. Cl.

| | |
|---|---|
| *F28F 1/00* | (2006.01) |
| *F01N 3/04* | (2006.01) |
| *F02G 5/02* | (2006.01) |
| *F28F 13/06* | (2006.01) |
| *F28D 7/16* | (2006.01) |
| *F28D 21/00* | (2006.01) |
| *H01L 35/30* | (2006.01) |

(52) U.S. Cl.
CPC .......... *F28D 7/1669* (2013.01); *F28D 21/0003* (2013.01); *F28F 13/06* (2013.01); *H01L 35/30* (2013.01); *F01N 2240/02* (2013.01); *F01N 2240/36* (2013.01); *F01N 2260/14* (2013.01); *F01N 2410/00* (2013.01); *F01N 2410/02* (2013.01); *F01N 2470/08* (2013.01); *F01N 2470/24* (2013.01); *Y02T 10/16* (2013.01); *Y02T 10/166* (2013.01); *Y02T 10/20* (2013.01)

(56) References Cited

U.S. PATENT DOCUMENTS

| | | |
|---|---|---|
| 6,730,274 B1 | 5/2004 | Ideguchi et al. |
| 6,857,468 B2 | 2/2005 | Emrich |
| 7,252,809 B2 * | 8/2007 | Bruck et al. .............. 422/181 |
| 7,921,640 B2 | 4/2011 | Major |
| 8,327,634 B2 | 12/2012 | Orihashi et al. |
| 8,443,593 B2 | 5/2013 | Sloss et al. |
| 8,453,430 B2 | 6/2013 | Hodgson et al. |
| 8,656,710 B2 | 2/2014 | Bell et al. |
| 9,003,784 B2 | 4/2015 | Limbeck et al. |
| 2005/0284623 A1 | 12/2005 | Poole et al. |
| 2008/0028769 A1 | 2/2008 | Goenka |
| 2009/0049832 A1 | 2/2009 | Hase |
| 2011/0120106 A1 | 5/2011 | Brück et al. |
| 2011/0192141 A1 | 8/2011 | Schepers et al. |

FOREIGN PATENT DOCUMENTS

| | | |
|---|---|---|
| DE | 102005039794 A1 | 3/2007 |
| DE | 102008023937 A1 | 11/2009 |
| EP | 1033481 A1 | 9/2000 |
| EP | 1455079 A2 | 9/2004 |
| EP | 2288796 B1 | 12/2011 |
| JP | 10281014 A | 10/1998 |
| JP | 2000018095 A | 1/2000 |
| JP | 2008144595 A | 6/2008 |
| JP | 2010031671 A | 2/2010 |
| JP | 2010163899 A | 7/2010 |
| RU | 2081337 C1 | 6/1997 |
| WO | 2008068632 A2 | 6/2008 |
| WO | 2010023118 A1 | 3/2010 |
| WO | 2010057578 A2 | 5/2010 |
| WO | 2010057779 A1 | 5/2010 |
| WO | 2010067196 A2 | 6/2010 |
| WO | 2011011795 A2 | 1/2011 |

\* cited by examiner

DEVICE HAVING A HEAT EXCHANGER FOR A THERMOELECTRIC GENERATOR OF A MOTOR VEHICLE AND MOTOR VEHICLE HAVING THE DEVICE

CROSS-REFERENCE TO RELATED APPLICATION

This is a continuation, under 35 U.S.C. §120, of copending International Application No. PCT/EP2012/056332, filed Apr. 5, 2012, which designated the United States; this application also claims the priority, under 35 U.S.C. §119, of German Patent Application DE 10 2011 016 886.9, filed Apr. 13, 2011; the prior applications are herewith incorporated by reference in their entirety.

BACKGROUND OF THE INVENTION

Field of the Invention

The present invention relates to a device having a heat exchanger for a thermoelectric generator, in particular for placement in the region of an underbody of a motor vehicle. The invention also relates to a motor vehicle having the device.

The exhaust gas from an internal combustion engine of a motor vehicle exhibits thermal energy. It is the intention for that thermal energy to be converted into electrical energy by using a thermoelectric generator, for example in order to charge a battery or some other energy storage device and/or to supply required energy directly to electrical consumers. In this way, a greater amount of energy is made available for the operation of the motor vehicle. The energy efficiency of an internal combustion engine is further increased through the use of a thermoelectric generator.

A thermoelectric generator of that type has at least a multiplicity of thermoelectric converter elements, which are modular, if appropriate. Thermoelectric materials are materials which can convert thermal energy into electrical energy (Seebeck effect) and vice versa (Peltier effect) in an effective manner. The Seebeck effect is based on the phenomenon of the conversion of thermal energy into electrical energy and is utilized for generating thermoelectric energy. The Peltier effect is the reverse of the Seebeck effect, is a phenomenon associated with heat adsorption and is generated in relation to a current flow through different materials. The Peltier effect has already been proposed, for example, for thermoelectric cooling.

Such thermoelectric converter elements preferably have a multiplicity of thermoelectric elements which are positioned between a so-called hot side and a so-called cold side. Thermoelectric elements include, for example, at least two semiconductor blocks (p-type and n-type), which are alternately connected on their upper and lower side (respectively facing the hot side and the cold side) to electrically conductive bridges. Ceramic plates or ceramic coatings or plastics and/or similar materials serve for insulating the metal bridges and are thus preferably disposed between the metal bridges. If a temperature gradient is provided on both sides of the semiconductor blocks, a voltage potential is formed. In that case heat is absorbed at one contact point (hot side), with the electrons passing from the one side to the higher-energy conduction band of the following block. On the other side the electrons can now release energy in order to return to a lower energy level (cold side). A flow of current can thus occur given a corresponding temperature gradient.

A wide variety of challenges must be overcome in the construction of thermoelectric generators and in the use thereof in a motor vehicle. Among other things, good heat transfer must be provided within the thermoelectric converter elements in such a way that the temperature differences present can be efficiently converted for conversion into electrical energy. Furthermore, in an internal combustion engine exhaust system, which operates under a wide variety of load conditions, a temperature level which is suitable for the thermoelectric elements must be provided. The placement of the thermoelectric elements within such a device or an exhaust system must also be considered with regard to those aspects. The configuration of a thermoelectric generator which includes the thermoelectric elements poses a problem in that, on one hand, as much heat as possible from the exhaust gas should be utilized for generating electrical energy and thus a correspondingly close-coupled configuration would be advantageous. However, on the other hand, the restricted space conditions and the admissible maximum temperatures must be taken into consideration.

BRIEF SUMMARY OF THE INVENTION

It is accordingly an object of the invention to provide a device having a heat exchanger for a thermoelectric generator of a motor vehicle and a motor vehicle having the device, which overcome the hereinafore-mentioned disadvantages and at least partially solve the highlighted problems of the heretofore-known devices and vehicles of this general type. It is sought, in particular, to specify a device which can be used at all operating points of an internal combustion engine and which exhibits high efficiency in the conversion of thermal energy from exhaust gas. Furthermore, the device should have as space-saving a construction as possible and be suitable in particular for placement in the region of an underbody of a motor vehicle. Additionally, retroactive installation of the device into a motor vehicle should also be possible without the need for cumbersome measures for integration.

With the foregoing and other objects in view there is provided, in accordance with the invention, a device having a heat exchanger, in particular for placement in an exhaust system of an internal combustion engine in a motor vehicle. The heat exchanger has at least a housing with an inlet and an outlet for a fluid. Furthermore, the heat exchanger has an inner tube with an axial direction, with a first end side and with an opposite second end side and with a first circumferential surface which has openings. A multiplicity of heat exchanger tubes which are disposed, parallel to the axial direction, at the outside on the first circumferential surface, is also provided. The housing surrounds the heat exchanger tubes and the inner tube. The inlet is connected in terms of flow to the first end side. Furthermore, guide elements are disposed between the heat exchanger tubes in such a way that the fluid which enters the inner tube through the first end side flows over the heat exchanger tubes in a radial direction proceeding from the inner tube and is then passed into an outflow duct situated between heat exchanger tubes and the housing as viewed in the radial direction. The fluid is first diverted into a flow direction in the axial direction in the outflow duct and the outflow duct is connected in terms of flow to the outlet.

The housing preferably has a round, in particular circular or elliptical/oval shape, but is in no way restricted to such a shape. The fluid, in particular an exhaust gas of an internal combustion engine, flows into the housing through the inlet and in the axial direction into the inner tube through the first end side. The inner tube is provided with openings on its circumferential surface. The second end side of the inner tube is, in particular, constructed in such a way that it can be closed, so that the fluid exits the inner tube in a radial direction through the openings in the first circumferential surface of the inner tube. Guide elements which are provided outside the first circumferential surface of the inner tube extend, in particular, in the axial direction and in the radial direction in such a way that the fluid flows, in particular, exclusively in the radial direction over the guide elements and over the heat exchanger tubes disposed there, and thus enters the outflow duct while flowing in the radial direction. In particular, the outflow duct surrounds the inner tube and the guide elements and heat exchanger tubes over the full circumference. In this case, the fluid is diverted into an axial direction again and flows, in particular, along the housing in the direction of the outlet.

As a result of the, in particular exclusively, radial flow over the heat exchanger tubes, a uniform transfer of heat to the heat exchanger tubes is generated, in such a way that there are, in particular, no significant temperature differences on the outer surface of the heat exchanger tubes. In particular, the maximum temperature difference on the outer surface of the heat exchanger tubes, over which the fluid flows in the circumferential direction and in the axial extent of the heat exchanger tubes, amounts to at most 30 Kelvin, in particular at most 15 Kelvin, preferably at most 10 Kelvin and particularly preferably at most 5 Kelvin. In this way, the heat exchanger tubes are subject to uniform loading with regard to thermal gradients and thermal expansion.

In particular, the openings in the first circumferential surface of the inner tube are distributed in such a way that there is a uniform flow distribution over the first circumferential surface of the inner tube. A non-uniform flow through the first circumferential surface of the inner tube results from a non-uniform pressure distribution in the inner tube. That non-uniform pressure distribution is attributable primarily to the fact that the fluid impinges on a closed or at least partially closed second end side of the inner tube, and a relatively high back pressure is generated at this location in such a way that the throughput of fluid through the first circumferential surface would be greater there than in the region of the open first end side. A uniform flow distribution is attained through adaptation of the number and/or size and/or shape of the openings on the first circumferential surface. This means also that the same amount of fluid flows through the first circumferential surface of the inner tube per unit of area. In particular, relatively large openings and/or a greater number of openings are provided on the first circumferential surface in the region of the first end side of the inner tube. The openings may (in part) also be assigned (in each case one or more) guide structures (hoods, vanes, blades, etc.) through which, after the fluid passes through the opening, the fluid is guided, concentrated, focused, etc., toward the heat exchanger tubes.

The first circumferential surface of the inner tube is, in particular, at least 75% open, that is to say 75% of the first circumferential surface is formed by openings in the first circumferential surface. In this case, the openings also serve, in particular, for flow distribution, in such a way that the heat exchanger tubes disposed at the outside on the first circumferential surface are correspondingly impinged on by flow. This permits an improved transfer of heat from the fluid to the heat exchanger tubes and prevents an excessive pressure loss. The openings have, in particular, a largest diameter of at most 6 mm [millimeters].

In accordance with another advantageous feature of the heat exchanger of the invention, the outlet is connected in terms of flow to the second end side, wherein the second end side can be at least partially closed in such a way that a fluid stream through the first circumferential surface, on one hand, and through the second end side, on the other hand, can be controlled. In particular, a flap which can be actuated and/or moved in a targeted manner is disposed in the region of the second end side in such a way that, when the flap is completely or partially closed, the fluid does not flow, or flows partially, through the first circumferential surface. When the flap is in a fully open position, the fluid can flow substantially entirely through the second end side in the direction of the outlet of the housing. This is necessary, in particular, when the exhaust-gas temperature is too high, such that the heat exchanger tubes cannot be adequately cooled, or when no additional burden should be placed on the cooling configuration. Furthermore, it is thus also possible for the introduction of heat at exhaust-gas treatment units disposed downstream to be controlled in that only a controllable heat loss occurs as a result of the flow over the heat exchanger tubes. The thermal energy thus remains stored in the fluid and is first dissipated downstream of the heat exchanger to additionally provided exhaust-gas treatment units in an exhaust line. Furthermore, in the case of an elevated fluid throughput, the second end side can be at least partially opened in such a way that a pressure loss that arises as the flow passes through the heat exchanger is thereby kept low.

The control and/or adjustment of the closable second end side is preferably performed while taking into consideration the operating point of the internal combustion engine and/or taking into consideration characteristic values of the fluid (temperature, pressure, fluid composition). For this purpose, a controller may be provided which controls the fraction of fluid flowing through the second end side and/or through the first circumferential surface of the inner tube.

In accordance with a further advantageous feature of the device of the invention, thermoelectric elements are provided in the heat exchanger tubes. In this case, the thermoelectric elements are, in particular, stacked one on top of the other in annular form in the axial direction of the heat exchanger tube. The hot fluid (exhaust gas) flows over the heat exchanger tubes at the outside, and a cooling fluid (water) flows through the heat exchanger tubes in an inner duct. As a result of the temperature gradient thus generated between the outer surface and the inner duct of the heat exchanger tube, the electrically connected thermoelectric elements generate an electrical current which can be tapped off on the housing of the heat exchanger through suitable electrical terminals. The device with the heat exchanger is thus operated as a thermoelectric generator which is, in particular, connected to electrical storage devices or electrical consumers of the motor vehicle in such a way that, in this way, the current generated by the thermoelectric generator can be made available to the motor vehicle.

Due to the practically (virtually) exclusively radial flow over the heat exchanger tubes, it is possible in this case for identical thermoelectric materials to be used for the thermoelectric elements within the heat exchanger tubes because there is no (significant) temperature gradient along the first circumferential surface of the inner tube and/or on the outer surface, over which the fluid flows, of the heat exchanger tubes. A simple construction of the thermoelectric generator can thus be ensured, and electrical energy can be generated with high efficiency.

Consideration is given, in particular, to the following as thermoelectric materials for the thermoelectric elements:

n-type thermoelectric material: silicides (for example MgSi—MgSn)

p-type thermoelectric material: Zintl phases (for example $Zn_4Sb_4$)

These materials have proven to be particularly advantageous and permit an efficient conversion of the thermal energy of the hot fluid (exhaust gas) into electrical energy. The silicides are, in particular, binary metallic compounds of silicon, which can be utilized as semiconductors. The Zintl phases are, in particular, intermetallic compounds between highly electropositive alkali metals or earth alkali metals and moderately electronegative elements from the $13^{th}$ to $16^{th}$ groups of the periodic table. Some Zintl phases are diamagnetic semiconductors having a conductivity which rises with increasing temperature, by contrast to metallic conductors.

In accordance with an added advantageous feature of the device of the invention, an outer tube is provided which extends around the inner tube and the heat exchanger tubes and has a second circumferential surface with openings, and the guide elements are connected to the inner tube and/or to the outer tube. In this case, the connection is, in particular, of a cohesive form. The statements made with regard to the inner tube apply correspondingly to the outer tube.

In particular, the outer tube extends around the inner tube over the full circumference, in such a way that the heat exchanger tubes are disposed in the intermediate space between the inner tube and the outer tube. As a result of the configuration of the outer tube, the guide elements can be disposed between the heat exchanger tubes in a particularly advantageous manner because fixing of the guide elements at one side to the inner tube and at the other side to the outer tube is made possible in this way. In particular, the inner tube and the outer tube may be pre-assembled and provided as a unit together with the guide elements and the heat exchanger tubes, or without heat exchanger tubes, in such a way that the openings on the inner tube (and on the outer tube) are positioned in the corresponding orientation with respect to the guide elements and with respect to the heat exchanger tubes. In this case, a correct positioning encompasses a configuration which is adapted in terms of flow in such a way that the guide elements also do not partially close the openings and a pressure loss of the fluid entering through the first circumferential surface and/or exiting through the second circumferential surface is kept low.

In accordance with an additional feature of the invention, at least one guide element is produced from at least one metallic foil. The metallic foil is, in particular, at least 12 μm and at most 120 μm [micrometers] thick and is preferably composed of a steel including chromium and nickel. The guide element is, in particular, connected to the inner tube and/or to the outer tube in a cohesive manner by a soldered or brazed connection or welded connection so as to permit a permanent, temperature-resistant configuration of the guide element. It is preferable for two respective guide elements to be provided between each two respective heat exchanger tubes which are disposed adjacent one another as viewed in a circumferential direction.

In accordance with yet another feature of the invention, the at least one guide element is disposed at a spacing of 2 to 7 mm [millimeters] from a heat exchanger tube. This spacing results in an advantageous distribution of the fluid stream over the available outer surface of the heat exchanger tubes. In particular, the heat exchanger tubes have a greatest diameter of 25 to 35 mm [millimeters], in particular of up to at most 30 mm. In particular, the heat exchanger tubes are spaced apart from one another at a distance in the circumferential direction of 4 to 14 mm [millimeters].

In accordance with yet a further feature of the invention, at least one guide element and/or at least one heat exchanger tube is equipped with structures for generating turbulence in the fluid flow. These structures may be formed by an increased roughness and/or by microstructures and/or by the shape of the guide structures. These structures generate turbulence within the fluid stream around the heat exchanger tube, in such a way that a transfer of heat from the fluid stream to the heat exchanger tube is improved. In this way, an increased amount of heat energy is extracted from the fluid stream and dissipated through the heat exchanger tubes. In this way, more efficient use of the heat exchanger or of the thermoelectric generator is possible in this case. In one particularly advantageous refinement, it is (additionally or alternatively) provided that at least one heat exchanger tube is equipped, on its outer surface, with structures for generating turbulence in the fluid flow, wherein comparable structures to those on the guide element are used in that case. In particular, the structures are disposed on the heat exchanger tube and on the guide element and are coordinated with one another with regard to their positioning and their effect on the flow.

In particular, the microstructures are constructed in the form of pimples or knobs and/or indentations. The pimples or knobs extend outward proceeding from the surface of the guide element/heat exchanger tube, and the indentations extend inward.

In particular, the structures are formed by an increased roughness. In this case, the roughness of that surface of the heat exchanger tube which faces toward the fluid stream is increased in relation to the roughness on that surface of the heat exchanger tube which faces toward the thermoelectric elements or the cooling fluid. In particular, the roughness on that side of the heat exchanger tube which faces toward the fluid stream is increased by a factor of at least 5, preferably of at least 10 and particularly preferably of at least 20. The roughness is determined as a mean roughness Ra or an averaged roughness depth Rz. The methods for determining the characteristic roughness values are known to a person skilled in the art from international standards, for example from DIN (German Industry Standard) EN ISO 4287.

In accordance with yet an added advantageous feature of the invention, the pressure loss in the fluid flow between the inner tube and outflow duct is greater by at least a factor of 5, in particular by a factor of 10, than the pressure loss between a first end of the outflow duct and the outlet of the housing. In this case, the pressure loss of the fluid flow between the inner tube and outflow duct is measured in the inner tube at any desired point along the central axis of the inner tube and in the outflow duct at a point in the outflow duct situated in the radial direction proceeding from the measurement point in the inner tube. The measurement points for the pressure loss between a first end of the outflow duct and the outlet of the housing are measured at a point close to the closed side of the outflow duct in the region of the inlet or the first end side, and in the region of the central axis of the housing in the outlet. This ratio is intended to express that the fluid in the outflow duct and in the further flow region up to the outlet of the housing is not subject to any significant flow obstruction and thus experiences only a small pressure loss in this case. The actual pressure loss arises in the flow over the heat exchanger tubes, and is thereby also a criterion for the heat transfer between the fluid and the heat exchanger tubes. This results primarily from the fact that the pressure loss arises due to the obstruction of the fluid by the heat exchanger tubes disposed in the flow direction of the fluid. The fluid impinges on the heat exchanger tubes and is conducted around the latter. As uniform as possible a distribution of the fluid stream over the available outer surface of the heat exchanger tubes is attained by using the openings in the inner tube and, if appropriate, in the outer tube. These measures firstly lead to a relatively high pressure loss being generated in this region, and secondly, an optimization of the heat transfer between the fluid and the heat exchanger tubes is attained as a result. This ratio applies, in particular, for the situation in which exhaust gas is used as fluid, a mean exhaust gas volume flow rate that is common in motor vehicles is generated, the temperature of the exhaust gas lies in a range of from 200 to 600° C., and the exhaust gas is conducted in its entirety through the openings of the inner tube.

In accordance with yet an additional advantageous feature of the device of the invention, at least one guide element extends around a heat exchanger tube over an angle region of at least 120°. This is intended to express, in particular, that preferably all of the guide elements conduct the exhaust gas and/or the fluid around the outer surface of the heat exchanger tube. As a result of the radial flow of the fluid out of the inner tube, the available cross-sectional area over which the fluid flows in the direction of the outflow duct increases with increasing radius proceeding from the central axis of the inner tube. This increasing cross-sectional area is now restricted by the guide elements and simultaneously by the heat exchanger tubes disposed on the first circumferential surface of the inner tube. In this case, the fluid is guided along the outer surface of the heat exchanger tubes, in such a way that the most effective possible heat transfer between the fluid and the heat exchanger tube is attained in this case. For this reason, as large as possible an angle region of the heat exchanger tube is covered by the guide element in such a way that guidance of the fluid takes place in that region. In particular, the coverage of the heat exchanger tube is realized by an angle region on two sides of the heat exchanger tube, in such a way that a total of at least 240° of the heat exchanger tube is covered by the guide elements. In particular, the angle region relates to that region of the guide element which is spaced apart from the outer surface of the heat exchanger tube by 2 to 7 mm, in particular 2 to 12 mm.

In accordance with again another particularly advantageous feature of the invention, at least one guide element is disposed at a constant spacing with respect to an adjacent heat exchanger tube. In this case, the spacing between an outer surface of the heat exchanger tube and a guide element is, in particular, constant in relation to the extent of the heat exchanger tubes or of the guide element in the axial direction. In particular, this constant spacing relates additionally to the guide element and to the heat exchanger tube in the radial direction. This is intended to express that the fluid is conducted past the heat exchanger tube close to the surface over as large as possible a region of the outer surface of the heat exchanger tube, in such a way that a particularly good transfer of heat from the fluid to the heat exchanger tube is made possible in this case. It is very particularly preferable for a uniform spacing to be maintained with all guide elements and all heat exchanger tubes.

In accordance with again a further feature of the invention, at least one heat exchanger tube has an at least partially non-circular form. Moreover, it is preferable for at least one heat exchanger tube to at least partially (in one axial section) taper in the radial direction. In particular, the heat exchanger tube at least partially has an elliptical shape, wherein the larger diameter extends in the radial direction. In particular, at least one heat exchanger tube at least partially has a wing-shaped form. It is also very particularly preferable for (virtually) all sections which come into contact with the exhaust gas to have a corresponding shape adaptation in all heat exchanger tubes.

In particular, at least one heat exchanger tube at least partially has an elliptical profile and/or a wing-shaped profile. It is preferable in the case of a wing-shaped heat exchanger tube for the rounded, relatively thick first side to be oriented toward the inner tube and for the thinly tapering-out second side to be oriented in the radial direction toward the outflow duct. Through the use of such a non-circular shape of the heat exchanger tubes, the pressure loss is reduced due to an improved flow around them, and the heat transfer from the fluid to the heat exchanger tubes in the radial direction is homogenized. The relatively hot fluid, flowing in the radially outward direction, impinges initially on the relatively thick side of the heat exchanger tubes, in such a way that in this case, firstly very good heat transfer and secondly good heat dissipation within the heat exchanger tube are attained. In the radially outward flow direction, the fluid flows around the heat exchanger tubes, in such a way that the heat transfer is lower. Due to a reduction in the cross section of the heat exchanger tube on the radially outer side (in the case of an elliptical or wing-shaped form), it is also the case that less heat is dissipated to that side of the heat exchanger tube (by a cooling fluid). The ratio of heat transfer and heat dissipation is thus homogenized over the circumference of the heat exchanger tube.

In the case of an elliptical shape of a heat exchanger tube, the profile of the tube wall when viewed in a cross section of the heat exchanger tube corresponds approximately to an ellipse. In this case, opposite profiles of the tube wall are formed with (approximately) the same radius of curvature, whereas profiles offset by 90° form a different radius of curvature. In the case of a wing-shaped form of a heat exchanger tube, when viewed in cross section, the tube wall likewise encloses a rather elongate space, wherein in this case, the sections of the smallest radii of curvature are constructed differently. In particular, one of the two end sections is curved and the other forms a type of edge. In the case of a wing-shaped form of a heat exchanger tube, it is also possible for a wing (which operates without flow breakaway at both sides) to be formed.

In particular, structures are disposed on guide elements and/or on the heat exchanger tubes in such a manner that turbulence is generated in the fluid between the guide element and heat exchanger tube. In this way, the heat transfer is improved considerably even in the case of an elliptical or wing-shaped form of the heat exchanger tube in that region.

In the heat exchanger, it is possible in particular for a honeycomb body through which the fluid can flow radially to be disposed within the inner tube. The honeycomb body is, in particular, catalytically coated. In this case, the honeycomb body preferably extends over the entire circumferential surface of the inner tube. The honeycomb body may have a centrally disposed duct which is formed so as to be open toward the first end side and toward the second end side. The fluid consequently flows into the duct through the first end side and, depending on the position of the flap disposed downstream of the second end side, is diverted at least through the radially running flow paths of the honeycomb body in the direction of the inner tube. The inner tube preferably directly surrounds the honeycomb body and is, in particular, connected thereto at least in a force-locking or cohesive manner. A force-locking connection is one which connects two elements together by force external to the elements, as opposed to a form-locking connection which is provided by the shapes of the elements themselves.

In this context, cohesive connections are all connections in which the connecting partners are held together by atomic and/or molecular forces. They are, at the same time, non-releasable connections which can be severed only by destruction of the connections (for example connections generated by welding or brazing). Force-locking connections require a normal force with respect to the surfaces to be connected to one another. The displacement of the surfaces relative to one another is prevented as long as the counterforce effected by the static friction is not exceeded.

With the objects of the invention in view, there is concomitantly provided a motor vehicle, comprising an internal combustion engine, an exhaust-gas treatment device and a device according to the invention disposed in an exhaust line, wherein the fluid is an exhaust gas of the internal combustion engine. In particular, it is self-evidently possible for multiple heat exchangers to be provided in a single-strand or multi-strand exhaust line.

Other features which are considered as characteristic for the invention are set forth in the appended claims, noting that the features specified individually in the claims may be combined with one another in any desired technologically expedient manner and form further embodiments of the invention. The description, in particular in conjunction with the figures, explains the invention further and specifies supplementary exemplary embodiments of the invention.

Although the invention is illustrated and described herein as embodied in a device having a heat exchanger for a thermoelectric generator of a motor vehicle and a motor vehicle having the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

Figure 1:
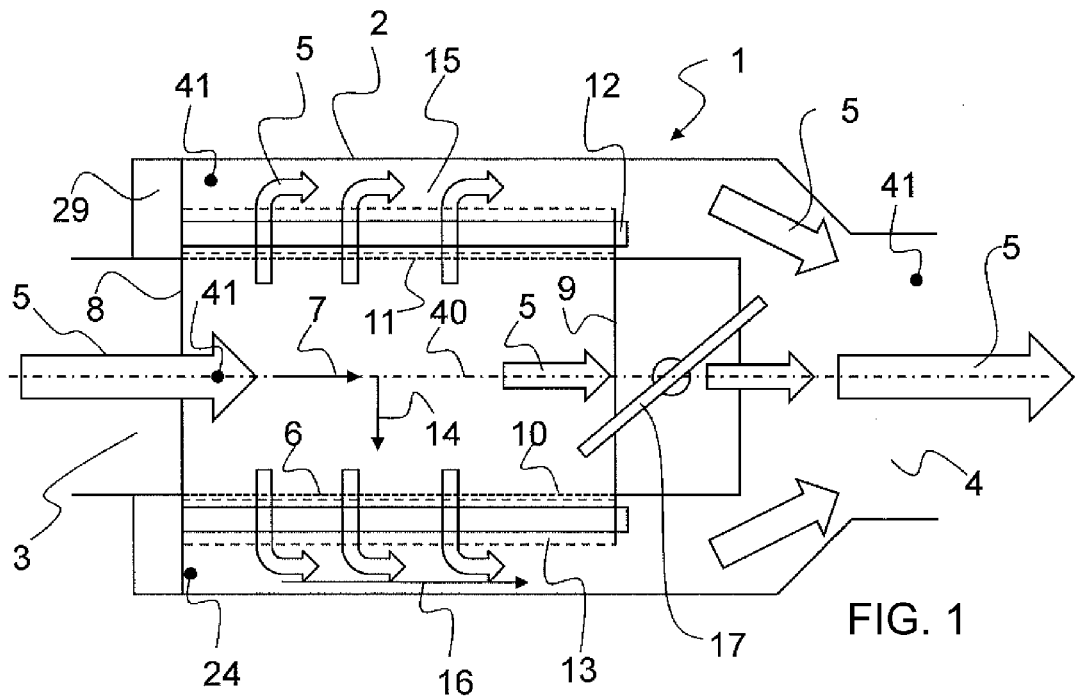
FIG. 1 is a diagrammatic, longitudinal-sectional view of a device with a heat exchanger.

Referring now in detail to the figures of the drawings, which show particularly preferred exemplary embodiments, to which the invention is not restricted and first, particularly, to FIG. 1 thereof, there is seen a heat exchanger 1 in a longitudinal section. A fluid 5 (or exhaust gas) flows through an inlet 3 and through a first end side 8, which is connected in terms of flow or fluidically to the inlet 3, into an inner tube 6 of the heat exchanger 1 in axial direction 7. In this case, a fluid stream is at least partially diverted, in such a way that the fluid 5 then flows in radial direction 14 toward a first circumferential surface 10 of the inner tube 6. The fluid 5 passes through the first circumferential surface 10 through openings 11, and impinges on heat exchanger tubes 12 disposed at the outside on the first circumferential surface 10. Guide elements 13, which are disposed between the heat exchanger tubes 12, guide the fluid 5 around the heat exchanger tubes 12. The fluid 5, flowing in the radial direction 14, passes into an outflow duct 15 which surrounds the heat exchanger tubes 12 at the outside and which itself is delimited at the outside by a housing 2. In this case, the fluid 5 is diverted again into the axial direction 7 and flows through the outflow duct 15 in the direction of an outlet 4. In FIG. 1, the outflow duct 15 has a cylindrical construction in the axial direction 7. A conical construction is correspondingly also possible, for example by virtue of the housing 2 widening in the direction of the outlet 4 along the outflow duct 15.

The fluid 5 may also exit the inner tube 6 along a central axis 40 of the inner tube in the axial direction 7 through a second end side 9. In this case, a flap 17 is provided which can at least partially close the second end side 9 of the inner tube 6. The fluid 5 flows downstream of the second end side 9, in the direction of the outlet 4.

It can be seen that the fluid 5 exits the inner tube 6 through openings 11 in the radial direction 14. The fluid 5 also maintains that direction as it flows over the heat exchanger tubes 12 and, in this case, as a result of the deflection around the heat exchanger tubes 12, a directional component also exists in the circumferential direction. It is only within the outflow duct 15 that the fluid 5 is diverted again into an axial direction 7. A flow direction 16 of the fluid stream in the outflow duct 15 is indicated in this case in the lower part of FIG. 1. The outflow duct 15 extends from a first end 24 in the region of the inlet 3 or in the region of the first end side 8 to the outlet 4. The inner tube 6 extends from the first end side 8 to the second end side 9 and is provided, over its entire first circumferential surface 10, with the openings 11 which are disposed in a controlled pattern in such a way that, taking into consideration, for example, an elevated back pressure in the region of the second end side 9 when the flap 17 is closed, a uniform outflow of the fluid 5 through the first circumferential surface 10 is realized.

A closure plate 29 is provided on the housing 2 in the region of the inlet 3 or of the first end side 8. The closure plate serves firstly for delimiting the outflow duct 15, which opens only in the direction of the outlet 4, and secondly for receiving the heat exchanger tubes 12, in such a way that a cooling fluid which flows through the heat exchanger tube 12 is supplied and discharged in this case. The heat exchanger tubes 12 extend along the first circumferential surface 10 from the closure plate 29 to the second end side 9. There, a diversion is provided which causes a cooling fluid to be returned to the closure plate 29 through a further heat exchanger tube 12. At the same time, non-illustrated electrical terminals may be provided in the closure plate 29 in such a way that an electrical current generated as a result of the temperature difference between the hot fluid 5 and cold cooling fluid within the heat exchanger tubes 12 can, due to the configuration of thermoelectric elements within the heat exchanger tubes, be output to the motor vehicle.

A pressure loss of the fluid stream within the heat exchanger 1 is determined, for example, at indicated measurement points 41.

Figure 2:
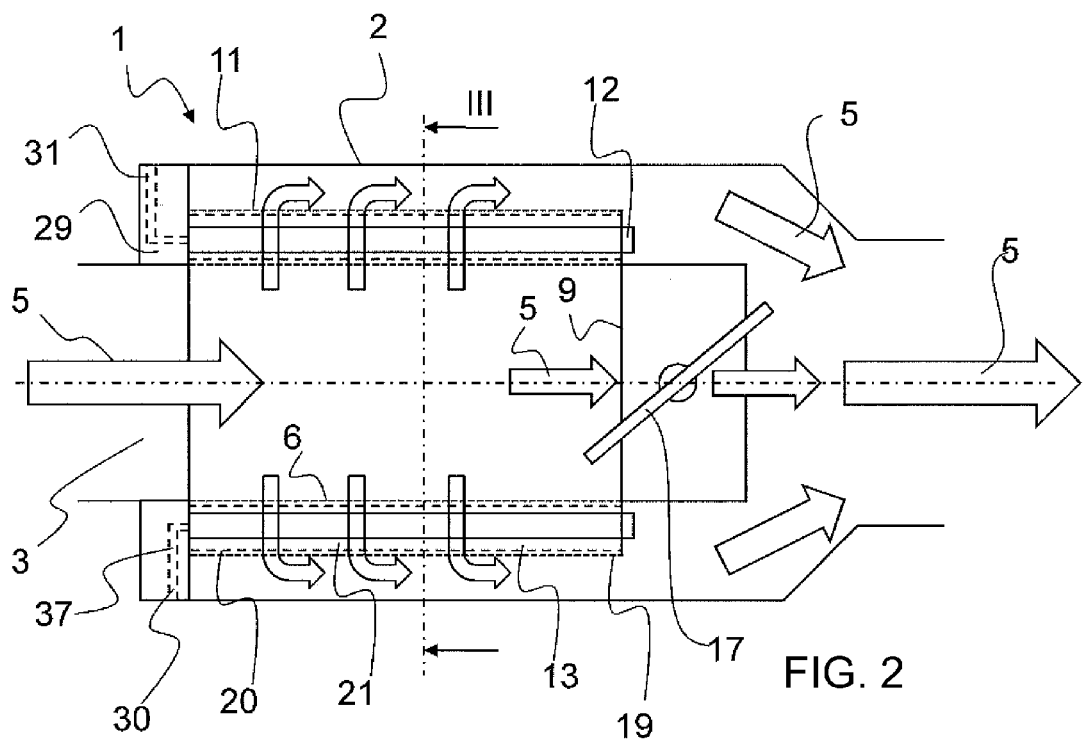
FIG. 2 is a longitudinal-sectional view of a further structural variant of the device.

FIG. 2 shows a second structural variant of the heat exchanger 1, likewise in a longitudinal section. In this case, identical components of the heat exchanger 1 are denoted by the same reference signs as in FIG. 1. The further structural variant of the heat exchanger 1 differs by the provision of an outer tube 19 which surrounds the guide elements 13 and the heat exchanger tubes 12 and has a second circumferential surface 20 with openings 11. As a result of the configuration of the outer tube 19, the guide elements 13, which are formed in this case by metallic foils 21, can be connected both to the inner tube 6 and also to the outer tube 19, and thus mechanically stabilized. A feed line 30 and a return line 31 for a cooling fluid 37 for the heat exchanger tubes 12, are also shown in the closure plate 29 in this case.

Figure 3:
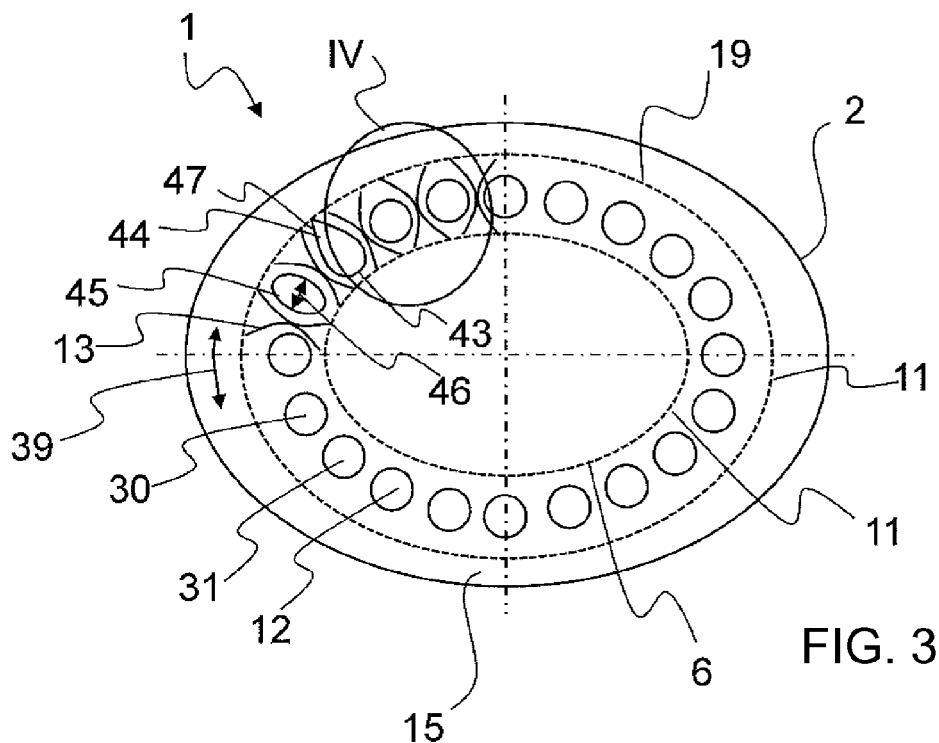
FIG. 3 is a cross-sectional view taken along a section line III of FIG. 2 in the direction of the arrows.

FIG. 3 shows the further structural variant of the heat exchanger 1 according to FIG. 2 in a cross section taken along a section axis III shown in FIG. 2. The housing 2 surrounds the outflow duct 15, the outer tube 19, the heat exchanger tubes 12 with the guide elements 13 disposed in between, and the inner tube 6. The inner tube 6 and the outer tube 19 each have openings 11 through which the fluid can flow from the inner tube 6 over the heat exchanger tubes 12 to the outflow duct 15. FIG. 3 also indicates a portion IV which is shown in more detail in FIG. 4.

It can be seen in FIG. 3 that at least some heat exchanger tubes 12 have an elliptical or wing-shaped form. A thick, rounded first side 43 of the wing-shaped profile 44 is oriented toward the inner tube 6 in this case. A thin second side 47 is disposed radially at the outside toward the outflow duct 15. In the case of an elliptical profile 45, a relatively small diameter 46 is disposed parallel to a circumferential direction 39. Through the use of the profiles 44, 45, the fluid 5 is diverted around the heat exchanger tubes 12, so that in particular, a lower pressure loss is generated than in the case of circular heat exchanger tubes 12. As a result of the placement of structures 23 on the guide elements 13 and/or on the heat exchanger tubes 12 (see FIG. 4), the heat transfer in the region between the heat exchanger tube 12 and guide element 13 is improved. The structures 23 can generate more intense turbulence with greater pressure loss in that region than in the case of circular heat exchanger tubes 12, because the pressure loss as the flow impinges on and flows around the profiles 44, 45 (without structures 23) is lower.

Figure 4:
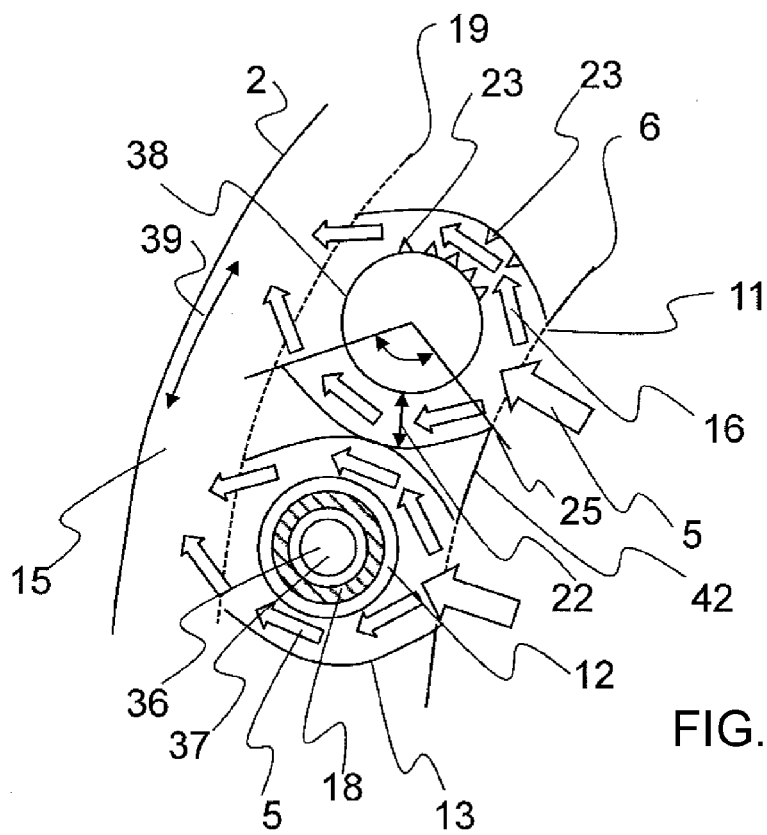
FIG. 4 is an enlarged, fragmentary view of a portion IV of FIG. 3.

FIG. 4 shows a portion of FIG. 3, with which the flow around the heat exchanger tubes 12 will be explained in more detail herein. The fluid 5 flows from the inner tube 6 through openings 11 into an intermediate space between the inner tube 6 and the outer tube 19. In this case, openings 11 are provided where heat exchanger tubes 12 are disposed between guide elements 13. Those regions 42 of the inner tube 6 which are disposed exclusively between the guide elements 13 are closed in this case, in such a way that at these points, no fluid 5 can flow into the regions 42. The guide elements 13 make contact with one another in this case and are thus supported. This leads to additional mechanical fixing of the position of the guide elements 13. The fluid 5 is guided around the heat exchanger tubes 12 in the flow direction 16 by the guide elements 13. In this case, the fluid flows only in the radial direction 14 and in the circumferential direction 39. In ducts thus provided between the guide elements 13 and an outer surface 38 of the heat exchanger tubes 12, the structures 23 are provided which are intended to break up laminar boundary flows of the fluid 5 and thus permit an improved transfer of heat to the heat exchanger tubes 12. The guide elements 13 are disposed at a certain spacing 22 from the outer surface 38 of the heat exchanger tubes 12, in such a way that the fluid 5 is guided around the heat exchanger tube 12 over an angle region 25. It is this configuration that first permits the improved transfer of heat.

In the lower part of FIG. 4, one heat exchanger tube 12 is illustrated in detail in cross section in such a way that, in this case, annular thermoelectric elements 18 within the heat exchanger tube 12 are shown. The heat exchanger tube 12 also has an inner duct 36 through which the cooling fluid 37 flows. The fluid 5 exits the ducts between the guide elements 13 and the heat exchanger tubes 12 into the outflow duct 15 through the openings 11 of the outer tube 19. The outflow duct 15 is delimited at the outside by the housing 2.

Figure 5:
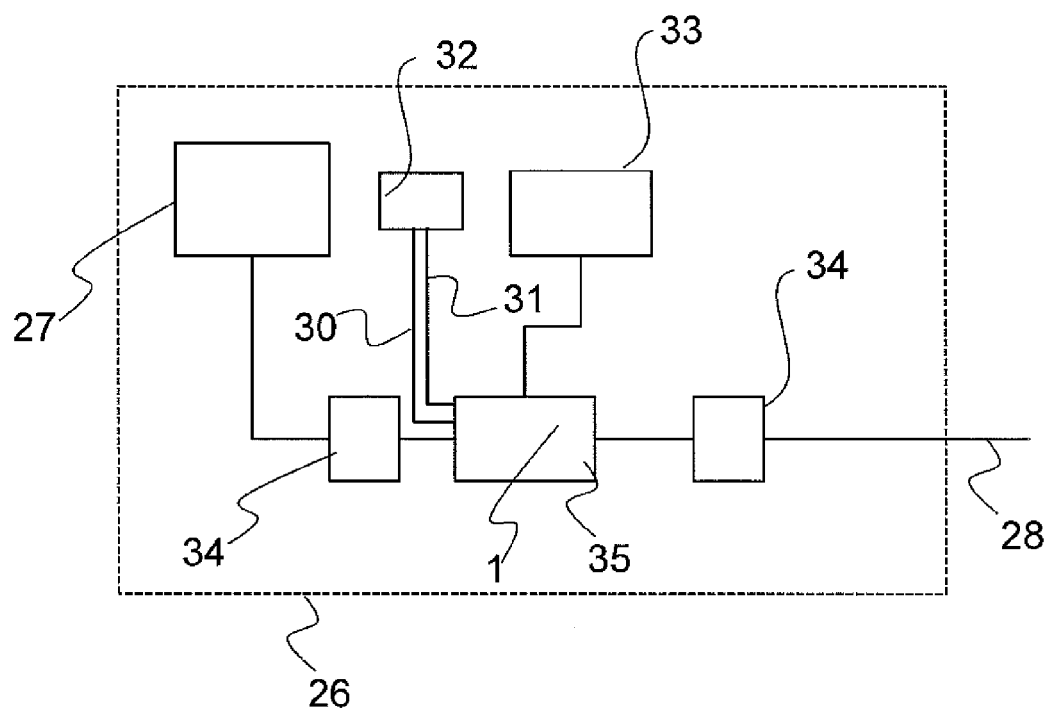
FIG. 5 is a block diagram of an exemplary configuration of a device of this type in a motor vehicle.

FIG. 5 shows a configuration of the heat exchanger 1 within a motor vehicle 26. The motor vehicle 26 has an internal combustion engine 27 with an exhaust line 28 and further exhaust-gas treatment components 34. The heat exchanger 1 in this case is in the form of a thermoelectric generator 35 and the heat exchanger tubes disposed in the thermoelectric generator are connected through a feed line 30 and a return line 31 to a cooling configuration 32. A regulating unit 33, which is also provided, serves inter alia for the actuation of the flap within the heat exchanger 1 in such a way that the amount of exhaust gas flowing through the first circumferential surface of the inner tube and/or through the second end side can be controlled. In this way, the bypass for conducting the fluid past the heat exchanger tubes and past the thermoelectric elements can be controlled in such a way that, if appropriate, no additional burden is placed on the cooling configuration 32 of the internal combustion engine by the exhaust gas in the thermoelectric generator 35.

Other refinements or structural variants of the invention are possible. In particular, it is possible for multiple closure plates 29 to be disposed within the housing 2 in such a way that the heat exchanger tubes 12 are held not only at one end but also at another end. It is thus also possible for the feed line 30 and the return line 31 to be disposed in each case in separate closure plates 29 in such a way that the flow passes through the heat exchanger tubes 12 only in one axial direction. In the figures shown herein, a cooling fluid 37 flows through the heat exchanger tubes in an axial direction 7 from the feed line 30 in the closure plate 29 in the vicinity of the inlet 3 to the second end side 9, and back to the return line 31 in the closure plate 29.

The invention claimed is:

1. A device having a heat exchanger, the device comprising:
    an inner tube having an axial direction, first and second mutually oppositely disposed end sides and a first circumferential surface having openings formed therein;
    a multiplicity of heat exchanger tubes disposed parallel to said axial direction outside of and on said first circumferential surface;
    an outer tube extended around said inner tube and said heat exchanger tubes and having a second circumferential surface with openings formed therein;
    a housing surrounding said heat exchanger tubes and said inner tube, said housing having an inlet and an outlet for a fluid, said inlet connected in terms of flow to said first end side;
    an outflow duct disposed between said heat exchanger tubes and said housing in a radial direction and connected in terms of flow to said outlet;
    guides disposed between said heat exchanger tubes, connected to at least one of said inner tube or said outer tube and configured to cause the fluid entering said inner tube through said first end side to flow from said inner tube over said heat exchanger tubes in said radial direction, then pass into said outflow duct and be diverted in said outflow duct into a flow direction in the axial direction;
    said guides and said heat exchanger tubes disposed on said first circumferential surface of said inner tube simultaneously restricting a cross-sectional area over which the fluid flows in said radial direction toward said outflow duct causing the fluid to be guided along an outer surface of said heat exchanger tubes; and a flap being disposed at said second end side and being movable between an open position and a closed position for controlling a fluid stream through said first circumferential surface and through said second end side.

2. The device according to claim 1, wherein said second end side is configured to be closed for controlling a fluid stream through said first circumferential surface and through said second end side.

3. The device according to claim 1, which further comprises thermoelectric elements disposed in said heat exchanger tubes.

4. The device according to claim 1, wherein at least one of said guides is produced from at least one metallic foil.

5. The device according to claim 1, wherein at least one of said guides is disposed at a spacing of from 2 to 7 mm from one of said heat exchanger tubes.

6. The device according to claim 1, wherein at least one of said guides or at least one heat exchanger tube is equipped with structures for generating turbulence in a fluid flow.

7. The device according to claim 1, wherein said outflow duct has a first end, and a pressure loss of a fluid flow between said inner tube and said duct is greater by at least a factor of 5 than a pressure loss between said first end of said outflow duct and said outlet of said housing.

8. The device according to claim 1, wherein at least one of said guides extends around a heat exchanger tube over an angular region of at least 120°.

9. The device according to claim 1, wherein at least one of said guides is disposed at a constant spacing relative to an adjacent heat exchanger tube.

10. The device according to claim 1, wherein at least one of said heat exchanger tubes at least partially has a wing-shaped profile or an elliptical profile.

11. The device according to claim 1, wherein said guides and said heat exchanger tubes reduce said cross-sectional area over which the fluid flows in said radial direction toward said outflow duct.

12. The device according to claim 1, wherein said flap is moved towards said open position when a temperature of the fluid is too high or when less burden is to be placed on a cooling fluid in said heat exchanger tubes.

13. A motor vehicle, comprising:
an internal combustion engine;
an exhaust line connected to said internal combustion engine; and
a device according to claim 1 disposed in said exhaust line and receiving exhaust gas from said internal combustion engine as the fluid.

* * * * *